United States Patent [19]

Nakata et al.

[11] Patent Number: 4,725,737
[45] Date of Patent: Feb. 16, 1988

[54] ALIGNMENT METHOD AND APPARATUS FOR REDUCTION PROJECTION TYPE ALIGNER

[75] Inventors: Toshihiko Nakata; Masataka Shiba, both of Yokohama; Yoshitada Oshida, Fujisawa; Sachio Uto, Yokohama; Atsuhiro Yoshizaki, Katsuta, all of Japan

[73] Assignee: Hitachi, Ltd., Tokyo, Japan

[21] Appl. No.: 797,131

[22] Filed: Nov. 12, 1985

[30] Foreign Application Priority Data

Nov. 13, 1984 [JP] Japan .............................. 59-237420
May 10, 1985 [JP] Japan .................................. 60-97720

[51] Int. Cl.⁴ ......................... G01V 9/04; G01B 11/00
[52] U.S. Cl. .................................... 250/548; 250/557; 356/399
[58] Field of Search ............... 250/548, 202, 557, 234; 356/399

[56] References Cited

U.S. PATENT DOCUMENTS 4,577,113 3/1986 Marantette et al. ................. 250/548

*Primary Examiner*—Gene Wan
*Attorney, Agent, or Firm*—Antonelli, Terry & Wands

[57] ABSTRACT

An alignment method and apparatus for reduction projection type aligner in which the rough detection of reticle position in the reticle alignment process at the time of mounting a reticle and the fine detection of reticle position in the wafer alignment for the alignment between a wafer and the reticle are performed automatically by the same reticle alignment pattern and the same optical alignment detection system. A plurality of one- or two-dimensional Fresnel zone plates having different shapes of diffraction patterns formed outside of a reticle circuit pattern and arranged at a position outward of the entrance pupil of the reduction projection lens are used as a reticle alignment pattern to detect the absolute position of the reticle. The detection field of view of the optical alignment detection system is thus effectively widened to make pattern detection possible with high magnification for an improved detection accuracy. The same reticle alignment pattern and the same optical alignment detection system are used for rough detection of reticle position in reticle alignment and fine detection of reticle position in wafer alignment. In the optical alignment detection system, on the other hand, the image position of the diffraction pattern from the reticle alignment pattern and the image position of the wafer alignment pattern are located at the same distance from the reticle surface.

15 Claims, 53 Drawing Figures

FIG. I
(PRIOR ART)

FIG. 3
FIG. 5
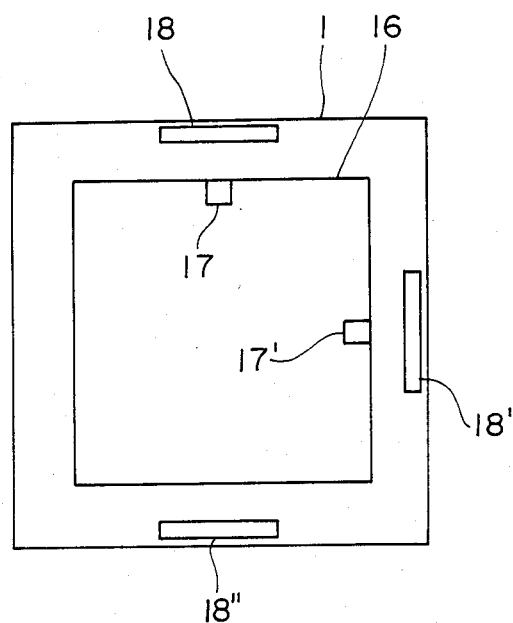
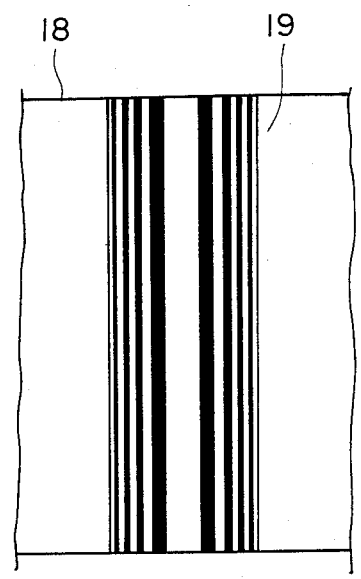
FIG. 4
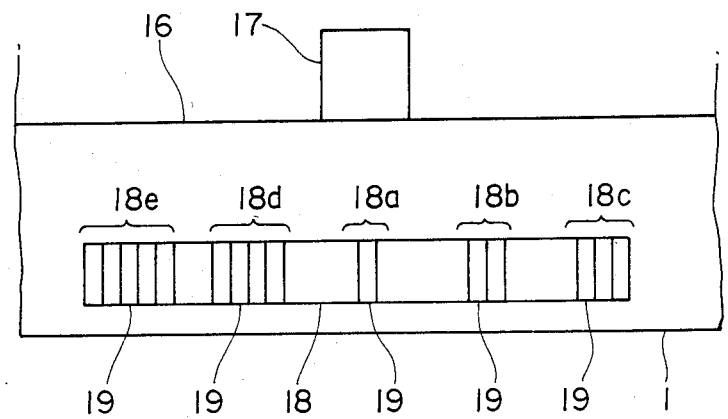

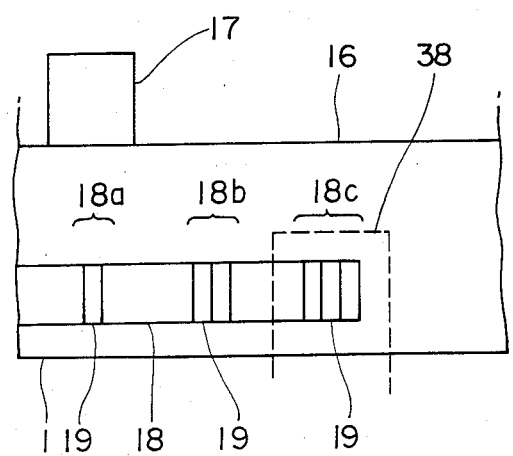
FIG. 6a
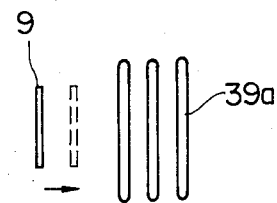
FIG. 6a'
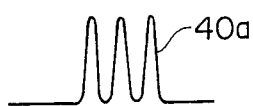
FIG. 6a"
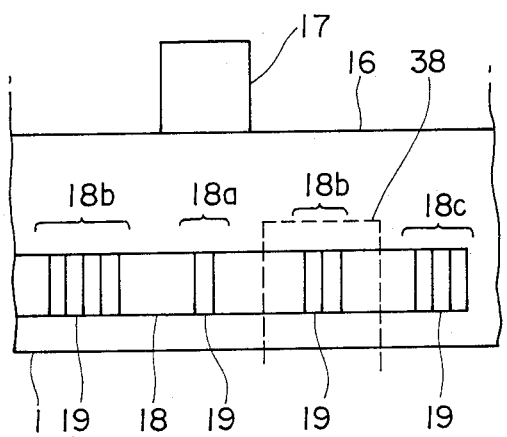
FIG. 6b
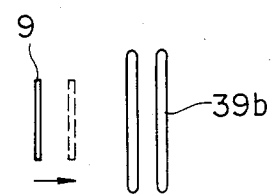
FIG. 6b'
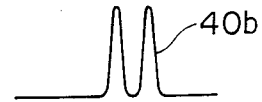
FIG. 6b"

FIG. 6c
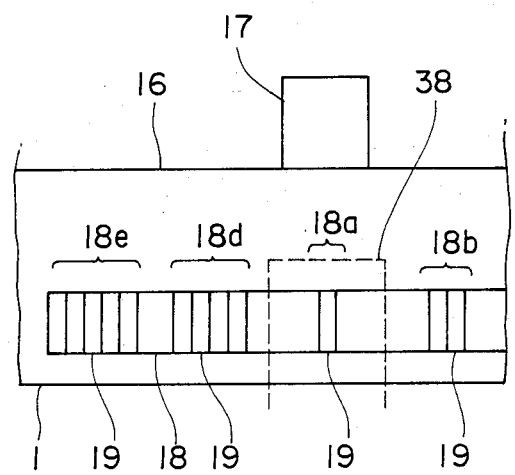
FIG. 6c'
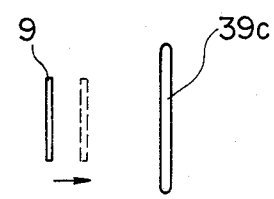
FIG. 6c"
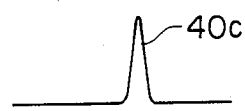

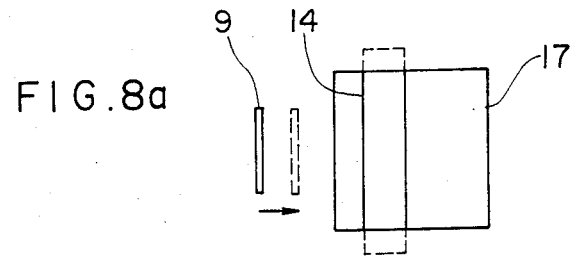
F I G . 8a
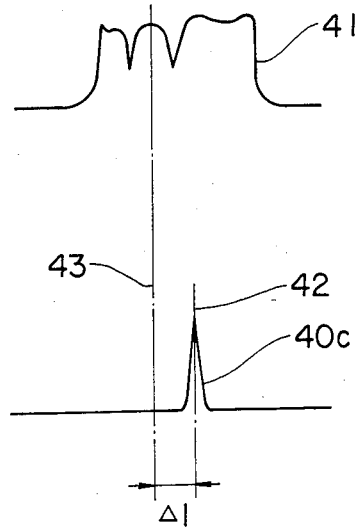
F I G . 8b
F I G . 8c
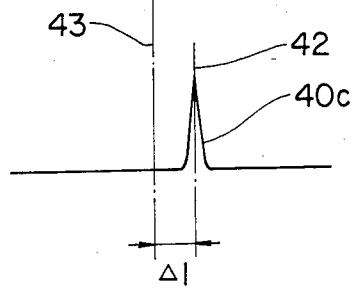
F I G . 9
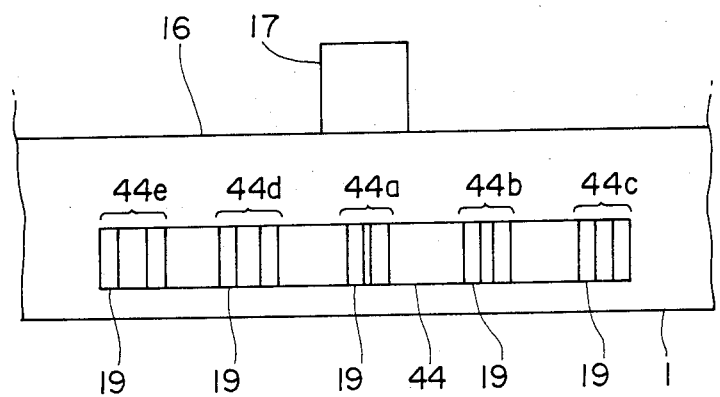

FIG.10a
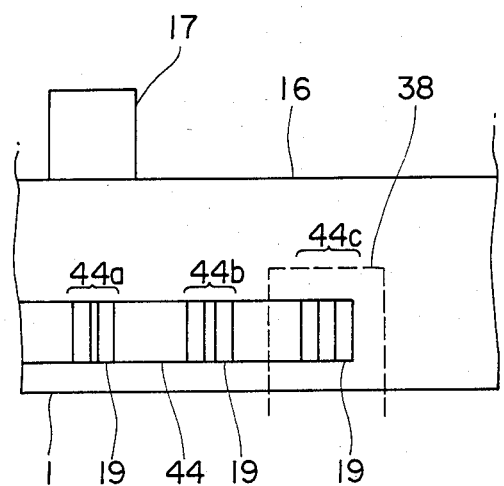
FIG.10a'
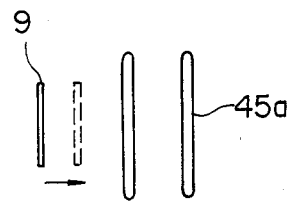
FIG.10a"
FIG.10b
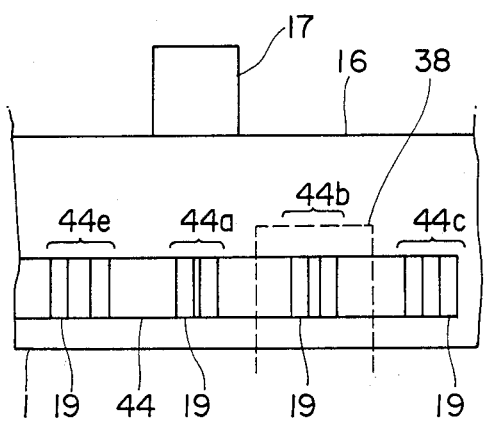
FIG.10b'
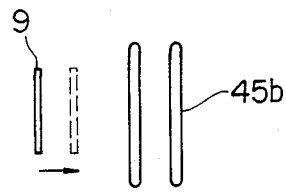
FIG.10b"
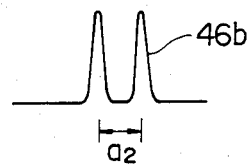

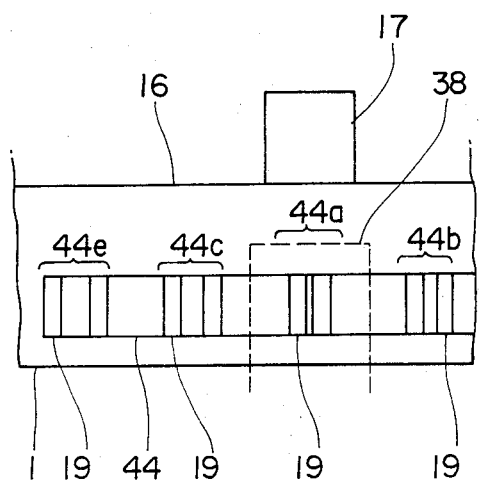
FIG. 10c
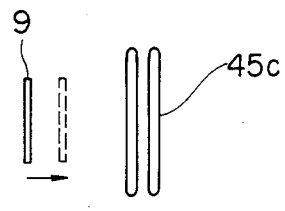
FIG. 10c'
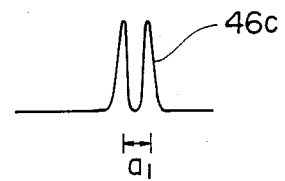
FIG. 10c"

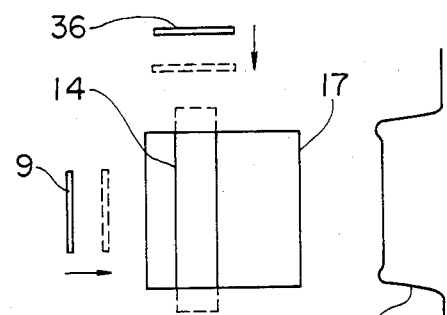
FIG. 16a
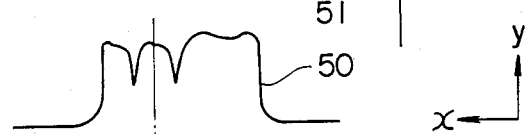
FIG. 16b
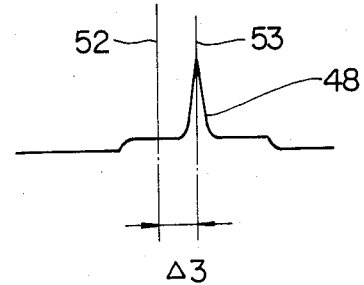
FIG. 16c
FIG. 17
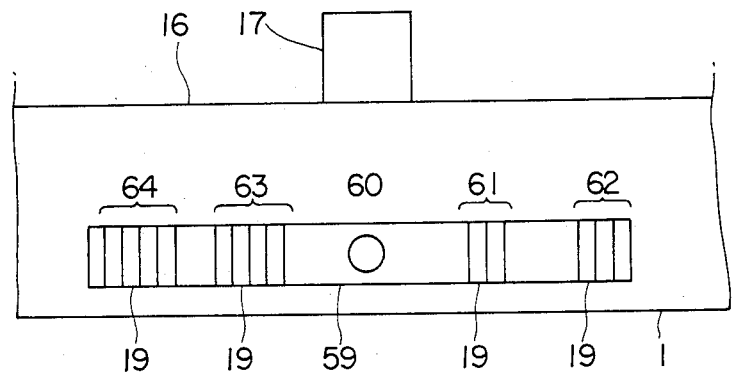

ALIGNMENT METHOD AND APPARATUS FOR REDUCTION PROJECTION TYPE ALIGNER

BACKGROUND OF THE INVENTION

The present invention relates to an alignment method and apparatus for a reduction projection type aligner in a reduction projection exposure process wherein the coarse detection of reticle position in reticle alignment and the fine detection of reticle position in wafer alignment are effected by use of the same reticle alignment pattern and the same optical alignment detection system.

With the progress of miniaturization of semiconductor integrated circuits, demand is for higher accurate alignment between reticle and wafer in the exposure with reduction projection type aligner. In view of this, it is apparent that the TTL (Through The Lens) alignment method with a reduction projection lens which is capable of meeting a chip arrangement error in a wafer by chip-by-chip alignment will account for a majority of production systems for high-density integrated circuits in the future.

In a conventional TTL alignment method as shown in FIG. 1, for example, each position of reticle initialization patterns 15, 15' is detected by optical reticle alignment systems 5, 5' to set a reticle 1 at initial position. The illumination light of the same wavelength as the exposure light from optical fibers 11, 11' of optical wafer alignment detection systems 6, 6' are applied through half mirrors 7c, 7c', condenser lenses 7b, 7b' and mirrors 7a, 7a', radiated on reticle alignment patterns 13, 13' separate from the reticle initialization patterns 15, 15', and then radiated on wafer alignment patterns 14, 14' through the reduction projection lens 2. The reflection light from wafer alignment patterns 14, 14' form images of wafer alignment patterns 14, 14' on the alignment patterns 13, 13' on the reticle 1 through the reduction projection lens 2. The patterns 13, 13'; 14, 14' are passed through the mirrors 7a, 7a', condenser lenses 7b, 7b', half mirrors 7c, 7c', magnification lenses 8, 8', mirrors 7d, 7d', and movable slits 9, 9' to photomultipliers 10, 10' to detect a position. If the positions of the patterns 13, 13' and 14, 14' fail to coincide with each other, a wafer stage 4 carrying the wafer 3 is moved along x and y axes thereby to render the positions of the patterns 13, 13' and 14, 14' coincident with each other. Upon completion of alignment this way, the exposure light from the exposure system 12 is used to expose the circuit pattern of the reticle 1 through the reduction projection lens 2 on one to several chips on the wafer 3. The alignment method of this type is disclosed in Japanese Patent Unexamined Publication Nos. 144270/78, 93974/79 and No. 41739/80.

In this alignment method, four optical alignment systems including the optical reticle alignment systems 5, 5' and the optical wafer alignment detection systems 6, 6' are arranged around the reticle 1, thereby posing the problem of a complicated and bulky general configuration. Another disadvantage is that a large detection field of view of the optical reticle alignment systems 5, 5' is required with the ordinary mounting accuracy of ±1 to 2 mm for the reticle 1, resulting in a lower detection resolution and a lower detection accuracy. Further, in the production of a high-density integrated circuit, the use of a resist is being studied with a light absorber or a multilayer resist to cope with the problem of defocus caused by the roughness of the resist surface or multiple interference in the resist. Since these resists offer a very low transmittance to light having the same wavelength as the exposure light, however, it is impossible to use the light of the same wavelength as the exposure light for illumination of a wafer alignment pattern. As a result, the exposure light and the light for illumination of a wafer alignment pattern are required to have different wavelength. Nevertheless, in view of the fact that the chromatic aberration of the reduction projection lens 2 is corrected only for the exposure light, the image of the wafer alignment patterns 14, 14' is not formed on the reticle 1 any longer but at a position distant from the reticle 1 by the amount of the chromatic aberration. Therefore, it is necessary to detect the reticle alignment patterns 13, 13' and wafer alignment patterns 14, 14' separately from each other, thereby further complicating the configuration of the optical detection system. In addition, the position of the reticle 1 is required to be detected twice during the period from the mounting of the reticle 1 to the complete detection of the wafer alignment, thus reducing the throughput.

SUMMARY OF THE INVENTION

The object of the precent invention is to solve the above-mentioned problems by providing an alignment method an apparatus in which alignment detection at the same position as at the time of exposure is easily effected with a simple configuration, thereby contributing to an improved throughput, e.g. an improved productivity of semiconductors.

According to the present invention, there is provided an alignment method an apparatus wherein the coarse detection of the reticle position in reticle alignment for mounting a reticle in an initial position and the fine detection of the reticle position in wafer alignment for rendering the reticle and wafer positions to coincide with each other are effected by the same reticle alignment pattern and the same optical alignment detection system.

BRIEF DESCRIPTION OF THE DRAWINGS

FIG. 3 is a plan view showing a plurality of alignment patterns on a reticle according to the present invention.

FIG. 4 is an enlarged view showing a plurality of the alignment patterns of FIG. 3.

FIG. 5 is a plan view showing a one-dimensional Fresnel zone plate making up a component element of a reticle alignment pattern of FIG. 4.

FIGS. 6a to 6c" are diagrams for explaining the relationship between the reticle position and a detection signal of a photomultiplier.

FIG. 8a is a plan view showing an image of a wafer alignment pattern.

FIG. 8b is a diagram showing a detection signal of a wafer alignment pattern.

FIG. 8c is a diagram showing a detection signal of a reticle alignment pattern.

FIG. 9 is an enlarged plan view of a plurality of reticle alignment patterns according to a second embodiment of the present invention.

FIGS. 10a to 10c'' are diagrams for explaining the relationship between the reticle position and a detection signal of the photomultiplier in the second embodiment.

FIGS. 16a to 16c are diagrams showing an image of a wafer alignment pattern on a movable slit, a detection signal thereof and a detection signal of a reticle alignment pattern.

FIG. 17 is an enlarged view of a plurality of reticle alignment patterns according to a fourth embodiment of the present invention.

DESCRIPTION OF THE PREFERRED EMBODIMENTS

Embodiments of the present invention will be described specifically below with reference to the drawings.

Figure 2:
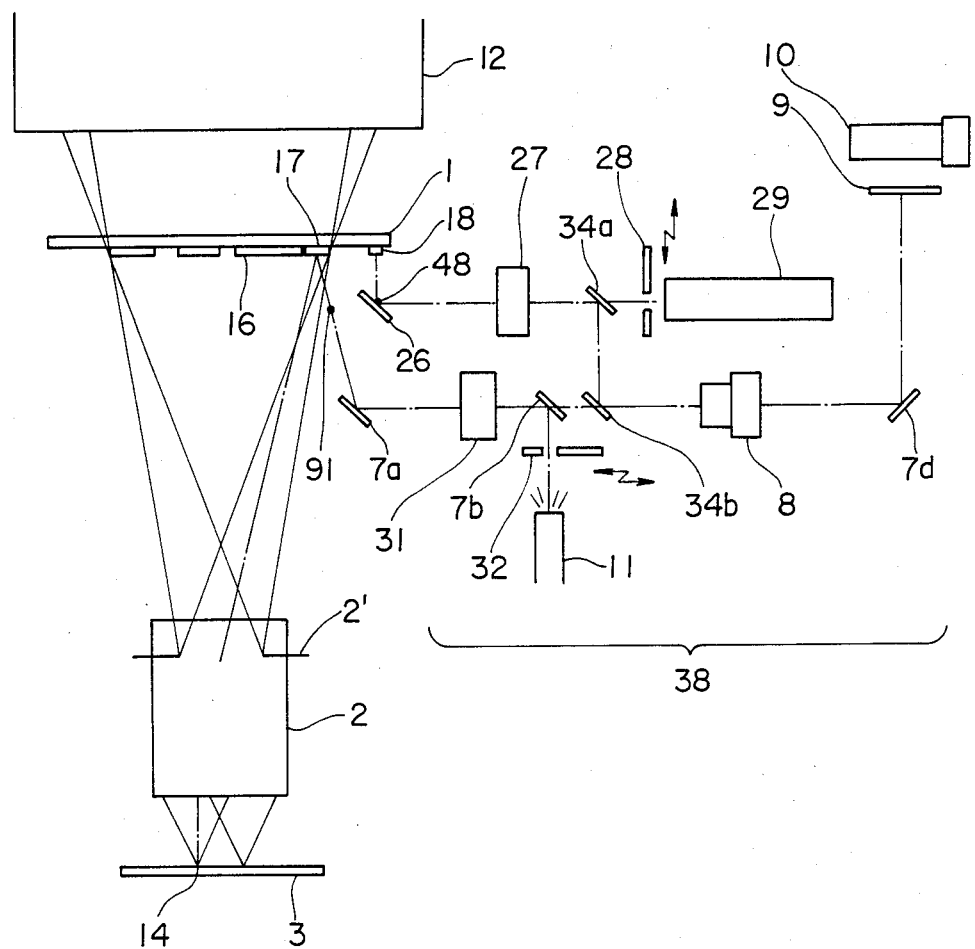
FIG. 2 is a schematic diagram of an optical alignment detection system according to an embodiment of the present invention.

First, FIG. 2 is a schematic diagram showing an optical alignment detection system according to a first embodiment, FIG. 3 a plan view of a plurality of alignment patterns on a reticle, FIG. 4 an enlarged plan view of a plurality of the reticle alignment patterns, and FIG. 5 a plan view showing a one-dimensional Fresnel zone plate making up a component element of a reticle alignment pattern of FIG. 4. In FIG. 2, reference numeral 1 designates a reticle making up a kind of mask. As shown in FIG. 2, a circuit pattern 16 carries thereon two mirror patterns 17, 17' at right angles to each other on the internal surface thereof and two rectangular reticle alignment patterns 18, 18' elongate along the edges thereof at right angles to each other on the surface of the reticle 1. These reticle alignment patterns 18, 18' are divided into five parts 18a to 18e each of which is combined with a different number (one to five) of Fresnel zone plate 19. Numeral 38 designates an optical alignment detection system, in which a light beam from a laser 29 is applied through a shutter 28 and radiated on the reticle alignment patterns 18 through a relay lens 27 and a mirror 26, diffracted by the diffraction effect of the one-dimensional Fresnel zone plate 19 and a diffraction pattern is formed linearly condensed at the position designated by 48 on the mirror 26. This image is applied through the relay lens 27, half mirrors 34a, 34b, a magnification lens 8 and a mirror 7d to form an image on the movable slit 9 and is detected by the photomultiplier 10. On the other hand, the shutter 28 may be closed with the shutter 32 open to radiate the wafer pattern illumination light from an optical fiber 11 on the mirror pattern 17 on the reticle 1 thorugh the shutter 32, the half mirror 7b, the relay lens 31 and the mirror 7a, so that the reflected light is radiated on the wafer alignment pattern 14 on the wafer 3 through the reduction projection lens 2, and the light reflected on the wafer alignment pattern 14 is returned along the same optical path to form an image on the movable slit 9 through the half mirror 34b, the magnification lens 8 and the mirror 7d thereby to be detected by the photomultiplier 10.

Figure 1:
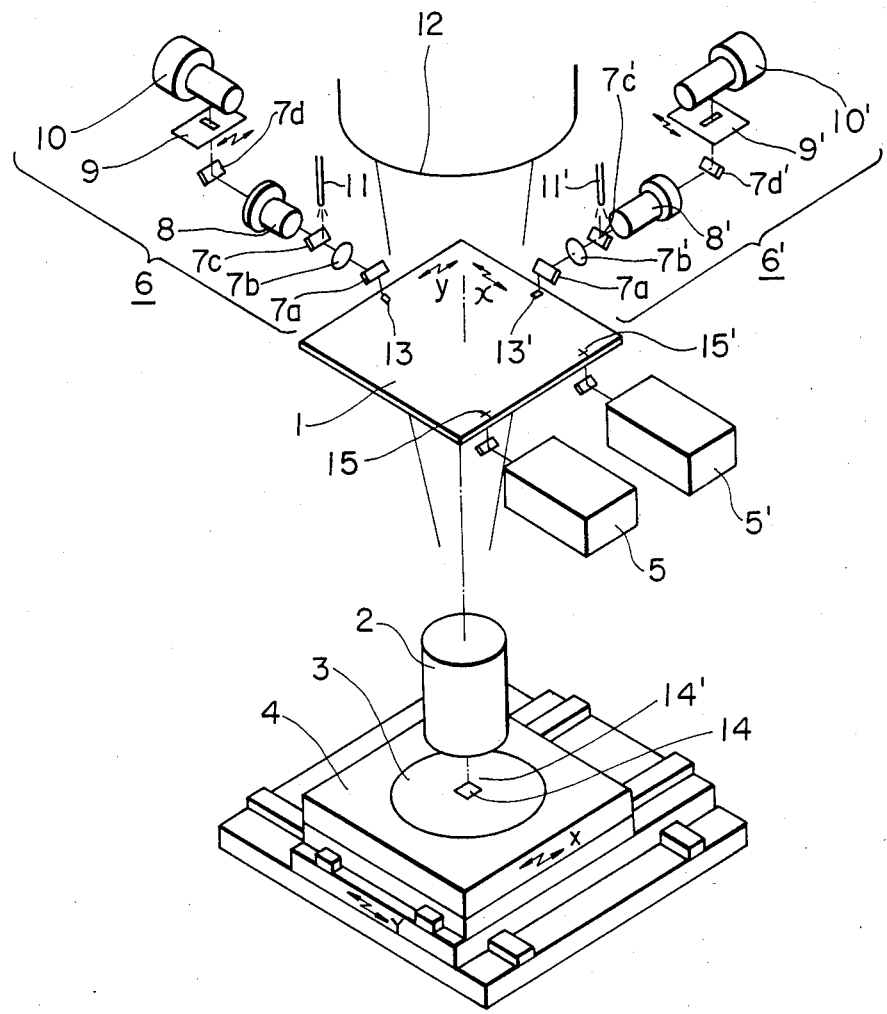
FIG. 1 is a perspective view showing an example of a conventional TTL alignment method.

The light for illuminating the wafer pattern from the optical fiber 11 has a wavelength different from the exposure light from the exposure system 12 to meet the requirement of the resist with a light absorber or the multilayer resist. The component elements other than described above have the same reference numerals as the corresponding elements in FIG. 1.

In this configuration, assume that in the diagram of FIG. 6a showing the relationship between the position of the reticle 1 and a detection signal of the photomultiplier 10, the detection field of view on the optical alignment detection system 38 is located as shown by a dashed line, that is, at the pattern 18c having the three one-dimensional Fresnel zone plates of the reticle alignment patterns 18. In this case, a diffraction pattern 39a formed on the movable slit 9 includes three linear pattern units as shown in FIG. 6a', and when the movable slit 9 is scanned along the direction of arrow, a detection signal 40a as shown in FIG. 6a'' is produced from the photomultiplier 10. Assume, on the other hand, that the detection field of view of the optical alignment detection system 38 is located at the pattern 18b having two one-dimensional Fresnel zone plates of the reticle alignment pattern 18 as shown by dashed line in FIG. 6b. In this case, the diffraction pattern 39b formed on the movable slit 9 makes up two linear pattern units as shown in FIG. 6b', so that when the movable slit 9 is scanned, a detection signal 40b as shown in FIG. 6b'' is produced from the photomultiplier 10. Also assume that the detection field of view of the optical alignment detection system 38 is located at the pattern 18a having a one-dimensional Fresnel zone plate of the reticle alignment patterns 18 at the same position as the mirror pattern 17 as shown by the dashed line in FIG. 6c, that is, at a set target position. The diffraction pattern 39c formed on the movable slit 9 makes up a single linear pattern unit as shown in FIG. 6c', so that when the movable slit 9 is scanned, a detection signal 40c as shown in FIG. 6c'' is produced from the photomultiplier 10. If the distance between the patterns 18a to 18e is set slightly smaller than the detection field of view of the optical alignment detection system 38 while at the same time preventing two alignment patterns from entering the detection field of view of the optical alignment detection system 38 at a time, therefore, it is possible to introduce each of the patterns 18a to 18e into the detection field of view of the optical alignment detection system 38 independently of each other. As a result, once the relationship is determined between the quantity of the one-dimensional Fresnel zone plate 19 of each of the patterns 18a to 18e and the distance between the central position of each of the alignment patterns 18a to 18e and the initial position of the reticle 1, that is, the central position of the reticle alignment patterns 18, therefore, it is possible to detect the absolute position of the reticle 1 from the number of the linear diffraction pattern units detected by the photomultiplier 10 and also to easily determine the distance covered from the detected position of the alignment pattern to the target position (initial position) of the reticle 1. Specifically, a plurality of reticle alignment patterns 18a to 18e equidistantly arranged are formed with one-dimensional Fresnel zone plates which form diffraction patterns of different shapes with each other, so that by detecting these diffraction patterns, the detection field of view of the optical alignment detection system 38 is effectively enlarged to the whole width of the reticle alignment pattern 18. As a result, the optical reticle alignment system according to the present invention is provided with the same or greater detection field than the conventional system, and therefore a pattern detection with higher magnification and higher accuracy than in the conventional system is attained on the one hand and the above-mentioned optical system can be used for detection of the reticle position in wafer alignment on the other hand.

Figure 7A:
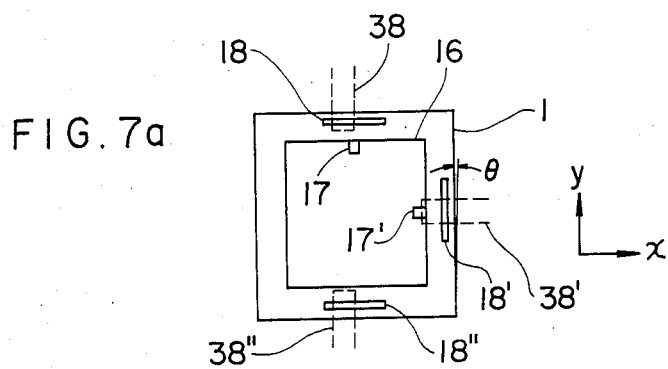
FIGS. 7a to 7d are diagrams for explaining the operation of a reticle alginment at the time of mounting the reticle.
Figure 7B:
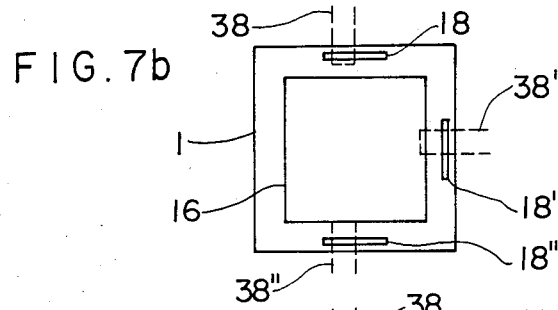

FIGS. 7a to 7d are diagrams for explaining the operation of the reticle alignment at the time of mounting the reticle according to an embodiment of the present invention. As shown in the drawings, three reticle alignment patterns 18, 18' and 18" including two at the ends of the y axis passing through the central position and one at an end of the x axis are provided on the reticle 1, and three optical alignment detection systems 38, 38' and 38" are arranged to detect the three reticle alignment patterns 18, 18' and 18" respectively. FIG. 7a shows the reticle 1 in its initial condition of mounting slanted by angle $\theta$. In this case, the two detection signals of the two reticle alignment patterns 18, 18" of the two opposed optical alignment detection systems 38, 38" are different from each other. A reticle rotation amount $\theta$ is determined from these two detection signals, so that the reticle stage carrying the reticle 1 (not shown) is rotated by $\theta$ thereby to render the two detection signals of the optical alignment detection systems 38, 38" coincident with each other. FIG. 7b shows the reticle 1 with the angular displacement thereof corrected.

Figure 7C:
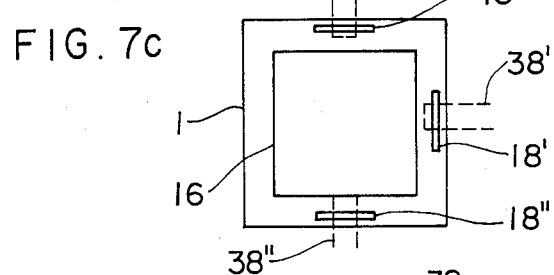
Figure 7D:
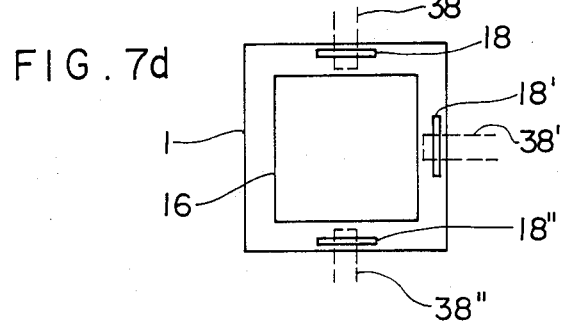

In the same drawing, the reticle 1 is displaced along the x axis from the set target position, and therefore, the two detection signals of the optical alignment detection systems 38, 38" opposed to each other are different from the detection signals of the two reticle alignment patterns 18, 18" at the set target position. The reticle stage (not shown) is thus inched along the x axis until the detection signals of the two reticle alignment patterns 18, 18" of the two optical alignment detection systems 38, 38" come to coincide with the detection signals of the two alignment patterns 18, 18" at the set target position, thereby making it possible to place the reticle 1 at the set target position along x axis as shown in FIG. 7c. Further, if the reticle is displaced along the y axis from the set target position as shown in the same diagram, the detection signal of the reticle alignment pattern 18' of the one optical alignment detection system 38' is different from that of the reticle alignment pattern 18' at the set target position. Therefore, the reticle stage (not shown) is inched along the y axis until it is stopped when the detection signal of the reticle alignment pattern 18' comes to coincide with that of the reticle alignment pattern 18' at the set target position, thereby making it possible to place the reticle 1 at the set target position along the y axis as shown in FIG. 7d. In this way, the reticle 1 displaced along the x or y axis or an angle can be set at the target position.

Now, the operation of the wafer alignment will be explained. First, with the shutter 28 closed and the shutter 32 open as shown in FIG. 2, a wafer pattern illumination light is radiated from the optical fiber 11, and through the relay lens 31, radiated on the mirror pattern 17 on the reticle 1. The light reflected from the mirror pattern 17 is radiated on the wafer alignment pattern 14 on the wafer 3 through the reduction projection lens 2. The light reflected from the wafer alignment pattern 14 is applied through the half mirror 34b and the magnification lens 8 to form an image on the movable slit 9. FIG. 8a shows an image of the wafer alignment pattern 14 on the mirror pattern 17 formed on the movable slit 9.

Then, the movable slit 9 is scanned in the direction of arrow, thus producing a detection signal 41 as shown in FIG. 8b from the photomultiplier 10. As shown in FIG. 8c, the error $\Delta 1$ between the central position 42 of the detection signal 40c stored at the end of reticle alignment and the central position 43 of the wafer alignment pattern 14 is determined, so that the reticle 1 or the wafer 3 is moved by the amount corresponding to such an error thereby to complete the wafer alignment.

As explained above, according to the embodiment under consideration, the alignment of the reticle 1 and the alignment between the reticle 1 and the wafer 3 are effected by the same reticle alignment pattern 18 and the same optical alignment detection system 38 and therefore both the parts around the reticle 1 and the whole configuration are simplified.

Further, since the mirror pattern 17 and the reticle alignment pattern 18 are located outside of the entrance pupil 2' of the reduction projection lens 2, the exposure light radiated on the reduction projection lens 2 from the exposure system 12 is not interferred with by the mirrors 7a and 26. As a result, the wafer alignment (the alignment between the reticle and the wafer) is made possible at the exposure position (not shown), thus greatly improving the throughput. Furthermore, the position 48 of forming a diffraction pattern from the reticle alignment pattern 18 and the position 91 of forming a wafer alignment pattern 14 are equal in distance from the surface of the reticle 1, with the result that any slant of the reticle 1 at the time of wafer alignment has a smaller effect thereon.

A second embodiment of the present invention will be explained with reference to FIG. 9.

FIG. 9 is an enlarged view of a reticle alignment pattern. As shown in FIG. 9, a mirror pattern 17 is disposed inside of a circuit pattern 16 on a reticle 1, and the reticle alignment pattern 44 formed elongate on the reticle 1 along the edge thereof. The reticle alignment pattern 44 is divided into a plurality of pattern units 44a to 44e, each arranged with two one-dimensional Fresnel zone plates 19, each interval thereof is different in a manner similar to the configuration shown in FIGS. 4 or 5. Though not shown, the optical alignment detection system used for detecting the reticle alignment pattern 44 is the same as in the optical alignment detection system 38 shown in FIG. 2. In view of this configuration, it is apparent from the relationship between the position of the reticle 1 and the detection signal of the photomultiplier 10 of the optical alignment detection system 38 shown in FIGS. 10a to 10c that diffraction patterns 45a, 45b, 45c comprising two linear diffraction pattern units each interval thereof being different, are formed on the movable slit 9 at the position of the detection field of view (shown by the dashed line) of the optical alignment detection system 38 as shown in FIGS. 10a' to 10c', so that when the movable slit 9 is scanned, detection signals 46a, 46b, 46c with two peaks of which gaps $a_1$, $a_2$, $a_3$ are different are produced as shown in FIGS. 10a'' to 10c''. The absolute position of the reticle 1 is detected by the number of linear diffraction pattern units in the case of FIG. 4, while according to the embodiment under consideration, the same absolute position of the reticle 1 is detected by use of the gap of two linear diffraction pattern units.

Figure 11A:
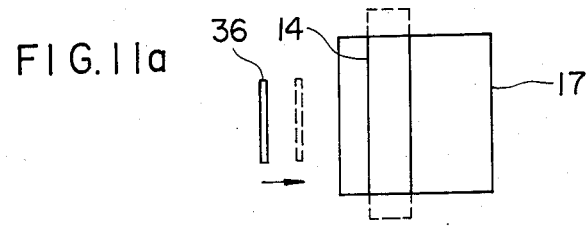
FIG. 11a is a plan view showing an image of a wafer alignment pattern.
Figure 11B:
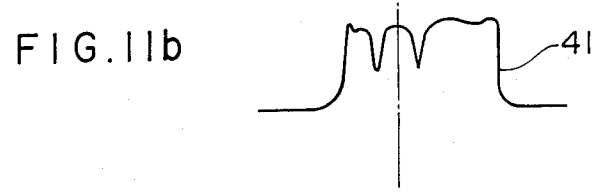
FIG. 11b is a diagram showing a detection signal of a wafer alignment pattern.
Figure 11C:
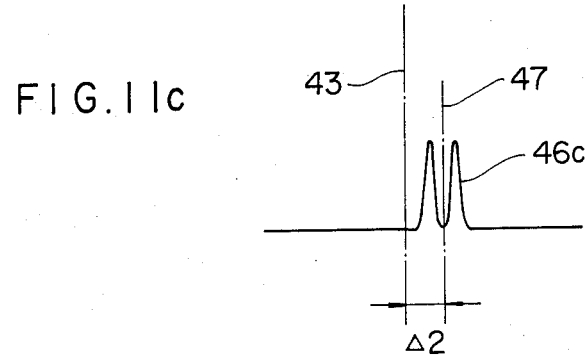
FIG. 11c is a diagram showing a detection signal of a reticle alignment pattern.

Upon detection of the absolute position of the reticle 1 this way, a wafer alignment pattern 14 and the mirror pattern 17 are formed on the movable slit 9 as shown in FIG. 11a. When the movable slit 9 is scanned, a detection signal 41 shown in FIG. 11b is produced from the photomultiplier 10. Then, as shown in FIG. 11c, the error $\Delta 2$ between the central position 47 of the detection signal 46c of the reticle alignment pattern 44 stored at the end of the reticle alignment and the central position 43 of the wafer alignment pattern 14 is determined, and the reticle 1 or the wafer 3 is moved by an amount equivalent the error $\Delta 2$, thus completing the wafer alignment.

Figure 12:
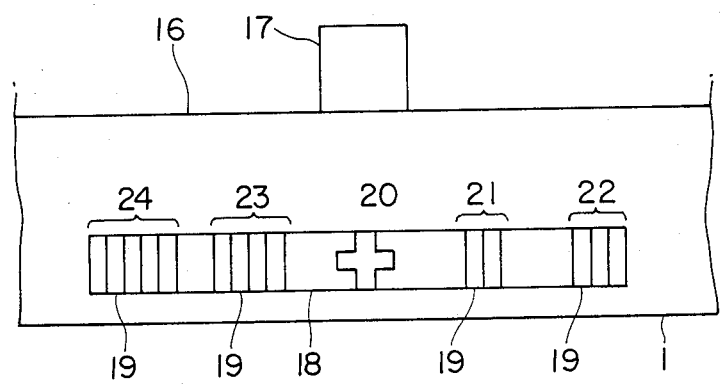
FIG. 12 is an enlarged view of a plurality of reticle alignment patterns according to a third embodiment of the present invention.
Figure 13:
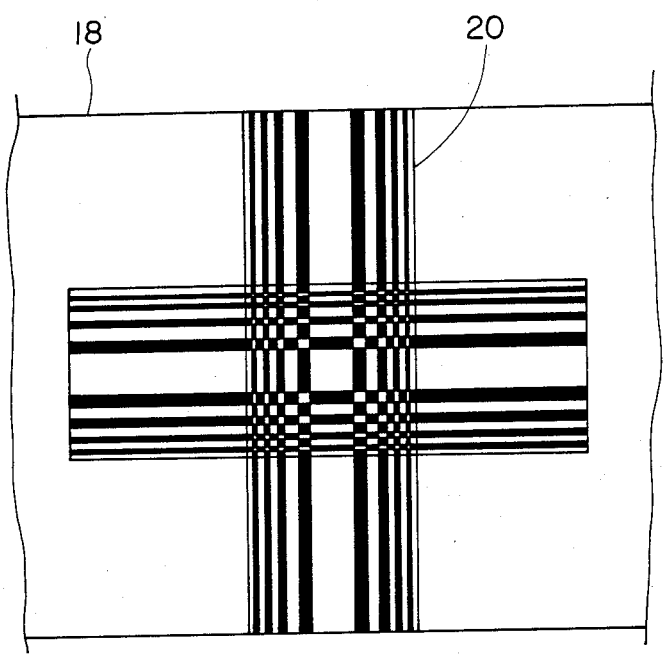
FIG. 13 is a plan view showing a crossed-type two-dimensional Fresnel zone plate making up a component element of a reticle alignment pattern.

Explanation will be made below of a third embodiment of the present invention. An enlarged view of a reticle alignment pattern according to a third embodiment is shown in FIG. 12. A plurality of pattern units 21 to 24 is combined with two to five one-dimensional Fresnel zone plates 19 respectively shown in FIG. 5. A pattern unit 20, on the other hand, is combined with one-dimensional Fresnel zone plates crossed as shown in FIG. 13.

Figure 14:
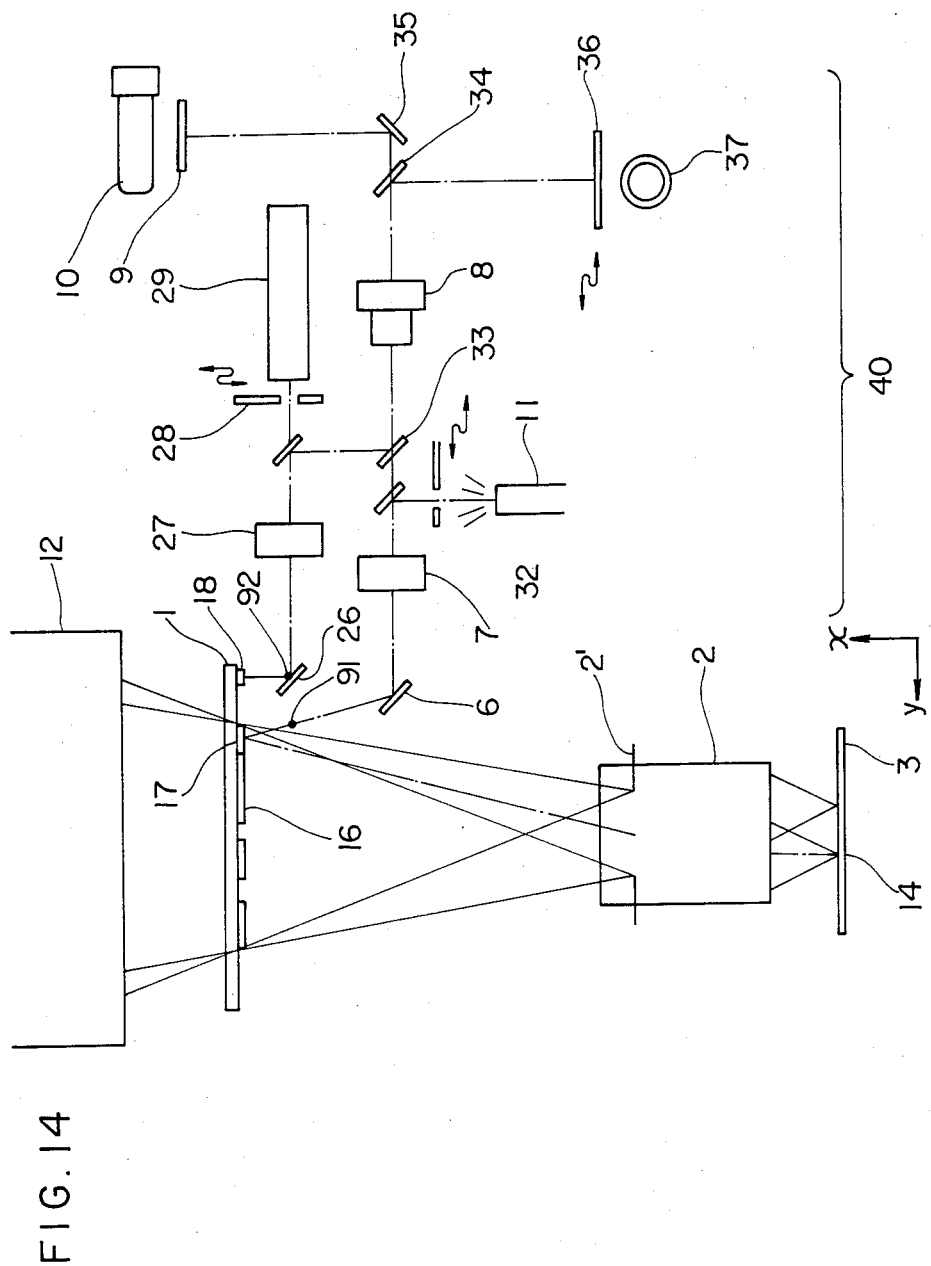
FIG. 14 is a schematic diagram showing an optical alignment detection system according to a third embodiment of the present invention.
Figure 15A:
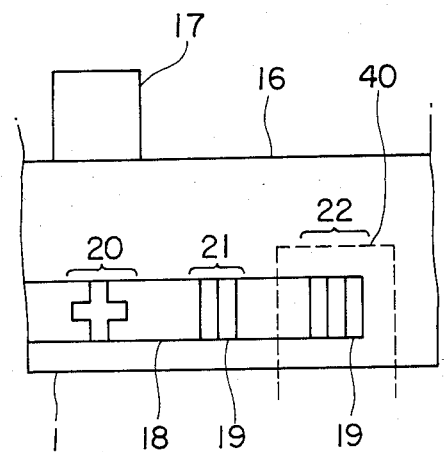
FIGS. 15a to 15f are diagrams showing the relationship between the reticle position and a detection signal.
Figure 15B:
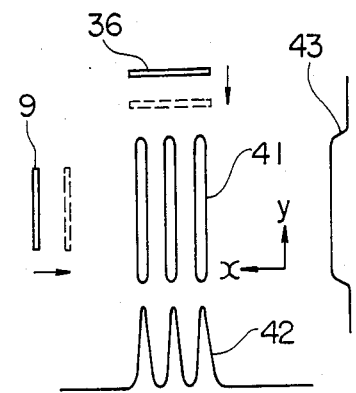
Figure 15C:
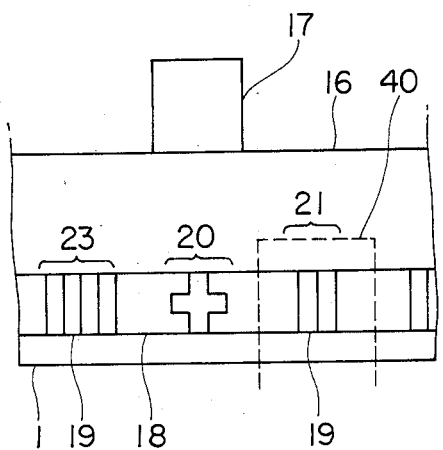
Figure 15D:
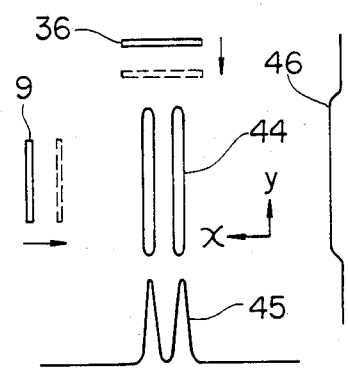
Figure 15E:
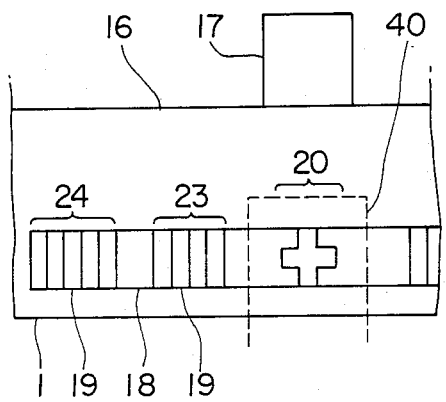
Figure 15F:
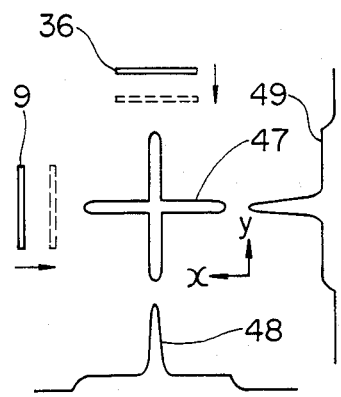

FIG. 14 shows an optical alignment detection system for detecting these alignment patterns for simultaneous execution of reticle alignment and wafer alignment. In this embodiment, a wafer pattern illumination light different in wavelength from the exposure light is used to meet the requirement of a resist with a light absorber or a multilayer resist. First, after the reticle 1 is mounted, a laser 29 radiates, a collimated beam through a mirror 26 on a reticle alignment pattern 18. When the collimated beam is radiated on the patterns 21 to 24, the reflected light is diffracted by the diffraction effect of the one-dimensional Fresnel zone plate 19 thereby to produce a diffraction pattern linearly condensed in elongate form along the y axis at the position designated by 92. If the collimated beam is radiated on the pattern 20, on the other hand, a crossed diffraction pattern is produced by the one-dimensional Fresnel zone plates at right angles to each other. The light intensity distribution along the x axis of these diffraction patterns is formed as an image on the movable slit 9 through the relay lens 27, the half mirror 33, the magnification lens 8, the half mirror 34 and the mirror 35, and detected by the photomultiplier 10. On the other hand, the light intensity distribution in the y direction is detected by a light electron multiplier 37 through the half mirror 34. In the case where the reticle 1 mounted is such that the pattern 22 is situated within the detection field of view of the optical alignment detection system 40 shown by dashed line in FIGS. 15a and 15b, for example, the diffraction pattern formed on the movable slits 9 and 36 takes three thin linear pattern units 41 along the y axis with the detection signal waveform with three peaks 42 along the x axis produced through the slit 9. The detection signal waveform along the y axis obtained through the slit 36, on the other hand, assumes a flat trapezoidal form. If the reticle 1 is at an other position, such as shown in FIG. 15c or 15d, the diffraction pattern takes the form of two linear pattern units 44, with the detection signal waveform including two peaks 45 along the x axis. As in the case of FIG. 15b, the detection signal waveform along the y axis takes a flat trapezoidal form shown by 46. When the reticle 1 is located at the set target position (reticle reference position) as shown in FIGS. 15e and 15f, on the other hand, the diffraction pattern is in a cross form 47 with the detection signal waveform having peaks 48, 49 along x and y directions. Specifically, if the distance between the patterns 20 to 24 is set smaller than the detection field of view in such a size that any two patterns may not enter the detection field of view at a time, one of the patterns 20 to 25 always exists in the detection field of view. As a result, if the number of the linear patterns and the distance between the central position of each of the patterns 21 to 24 and the reference position (set target position) of the reticle 1 (central position of the pattern 20) are known in advance, it is possible to detect the absolute position of the reticle 1 from the number of linear pattern units detected. It is also possible to easily determine the distance covered from the position of the patterns 21 to 24 detected to the reticle reference position. In other words, by detecting diffraction pattern units of different shapes arranged at regular intervals of space, the result is that the detection field of view of the optical alignment detection system has been effectively widened to the width of the reticle alignment pattern 18. In this way, a pattern detection of high magnification and high accuracy becomes possible with the same detection field of view as in the conventional optical reticle alignment system, and this optical system may be used also for the detection of reticle position for wafer alignment. The pattern 20 corresponding to the reticle reference position is in cross form for the reason mentioned below.

In the case where the reticle 1 is considerably away from the reference position, the position detection along the x and y axed is effected by the patterns 21 to 24 of the independent reticle alignment patterns 18 and 18', while when the reticle 1 is located in the vicinity of the reference position, on the other hand, the pattern 20 of either the reticle alignment pattern 18 or 18' is used for position detection along the x and y axes. The pattern 20, therefore, may be inserted only in one of the reticle alignment pattern 18 or 18', thus facilitating reticle production. Further, if a two-dimensional solid-state image sensor is used instead of the photomultipliers 10, 37 and slits 9, 36, the light intensity distribution along the x and y directions of the linear patterns 41, 44 and the cross pattern 47 can be detected at the same time, thereby reducing the size of the optical detection system.

After the reticle is set at the reference position and the reticle alignment is completed with the prevailing position of the signal peaks 48, 49 stored, the operation of wafer alignment is started. First, when the wafer pattern illumination light is radiated from the optical fiber 11 with the shutter 28 closed and the shutter 32 open, the mirror pattern 17 on the reticle 1 is radiated through the relay lens 7. The light reflected on the mirror pattern 17 reaches the wafer 3 through the reduction projection lens 2 thereby to radiate the wafer alignment pattern 14. The light reflected from the wafer alignment pattern 14 returns along the same light path and is formed as an image on the movable slit 9 through the half mirror 33, magnification lens 8, half mirror 34 and mirror 35, thus producing an image of wafer alignment pattern 14 as shown in FIG. 16a. When the movable slit 9 is scanned, the detection signal waveform of the light intensity distribution along the x direction obtained through the slit 9 takes a waveform 50 shown in FIG. 16b. The signal waveform 51, by the way, which is the detection signal waveform of light intensity distribution along y direction obtained through the slit 36, is not used for wafer alignment. The error Δ3 between the central position 53 of the detection signal peak 48 of the reticle alignment pattern stored at the end of the reticle alignment shown in FIG. 16c and the central position 52 of the wafer alignment pattern 14 is determined and is reduced to zero by moving the reticle or wafer, and the wafer alignment process is thus completed.

As described above, according to the present embodiment, the same reticle alignment pattern and the same optical alignment detection system are used for both the reticle alignment and the wafer alignment, so that the number of the optical alignment systems used is reduced and the parts around the reticle are simplified as compared with the conventional systems. Also, since the mirror patterns 17, 17' and the reticle alignment paterns 18, 18' are located outside of the entrance pupil 21' of the reduction projection lens 2, the exposure light is desirably prevented from being excluded by the mirror 6 or 26. Wafer alignment at the exposure position thus becomes possible (not shown), thus greatly improving the throughput. Further, in view of the fact that the position of image formation of the diffraction pattern from the reticle alignment pattern and that of the wafer alignment pattern are at the same distance from the reticle surface, the effect of the possible inclination of the reticle at the time of wafer alignment is almost eliminated. Further, in the case where the reticle is located in the vicinity of the reference position, the position detection along the x and y axes may be effected with only pattern 20 by use of a two-dimensional solid-state image sensor as a detector.

Figure 18:
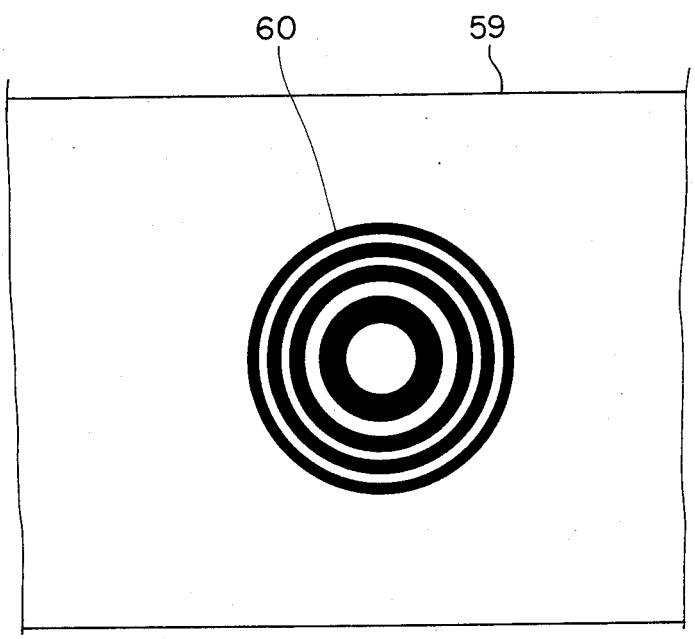
FIG. 18 is a plan view showing a circular Fresnel zone plate making up a component element of a reticle alignment pattern.

A fourth embodiment of the present invention will now be explained. FIG. 17 is an enlarged view of the alignment pattern on the reticle 1 according to this embodiment. Patterns 61 to 64, as in the case of the other embodiments, are combined with two to five one-dimensional Fresnel zone plates 19 shown in FIG. 5. The pattern 20, on the other hand, takes the form of a circular Fresnel zone plate shown in FIG. 18.

Figure 19:
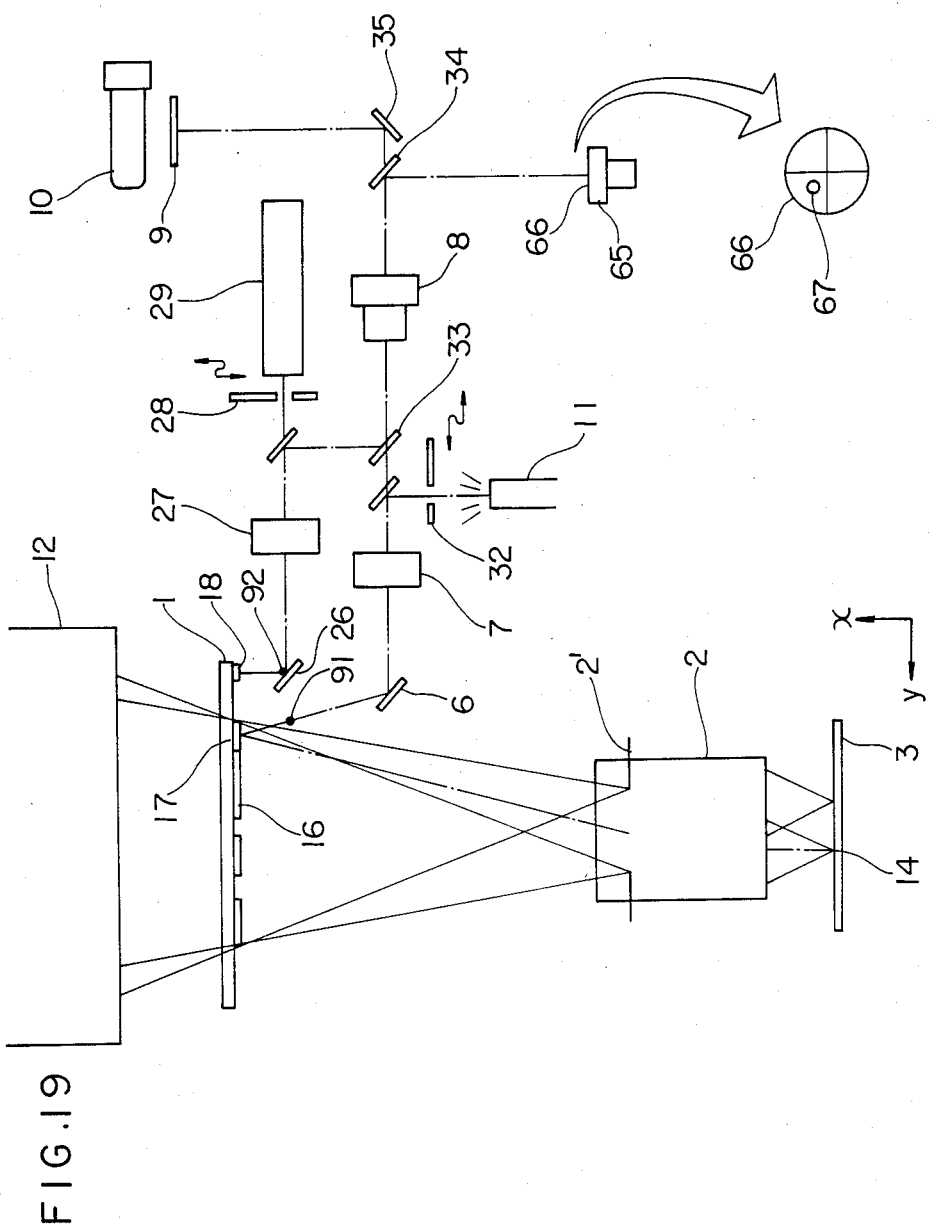
FIG. 19 is a schematic diagram showing an optical alignment detection system according to the fourth embodiment of the present invention.

FIG. 19 shows an optical alignment detection system for detecting these patterns for simultaneous reticle and wafer alignment. In this emboidment, as in the third embodiment, a light different in wavelength from the exposure light is used as a wafer pattern illumination light. In a manner similar to the third embodiment, after the reticle 1 is mounted, a collimated beam from a laser 29 is radiated on reticle alignment pattern 59 through a mirror 26. When the collimated beam is radiated on the patterns 61 to 64, the diffraction effect of the one-dimensional Fresnel zone plate 19 causes, as in the other embodiments, two to five diffraction pattern units corresponding to the number of Fresnel zone plates at the position designated by 92. When the pattern 60 is radiated, on the other hand, the light diffracted by the circular Fresnel zone plate takes the form of a small spot. The intensity distribution of the linear diffraction pattern is detected by the photomultiplier 10 by the scanning of the movable slit 9 through the relay lens 27, half mirror 33, magnification lens 8 and the mirror 35. The position of the diffraction pattern of spot formed by the circular Fresnel zone plate is also detected in similar manner by the quadrant photodetector 65 thorugh the half mirror 34 along both the x and y directions at the same time. Numeral 66 designates a photodetective surface and numeral 67 a spot diffraction pattern. As in the case of the third embodiment, when the reticle is considerably away from the reference position, the absolute position of the reticle is detected from the number of linear diffraction patterns. If the reticle is located in the vicinity of the reference position, by contrast, the position of the spot diffraction pattern is used to detect the reticle position along both the x and y directions at the same time. The circular Fresnel zone plate may be provided only on one of the x and y alignment patterns 59, 59'. In the manner mentioned above, the absolute position of the reticle along x and y directions is detected thereby to set the reference position of the reticle. And at this position, the x and y positions of the spot diffraction pattern are stored.

Figure 20A:
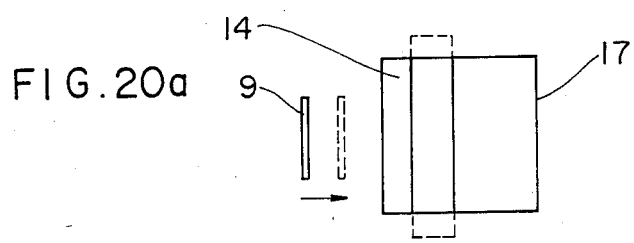
FIGS. 20a to 20d are diagrams showing an image of a wafer alignment pattern on a movable slit, a detection signal thereof, a spot diffraction image of the circular Fresnel zone plate on a four-quarter photodetector and a detection signal of the spot diffraction image respectively.
Figure 20B:
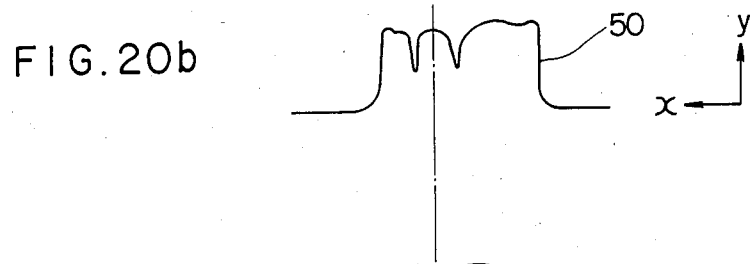
Figure 20C:
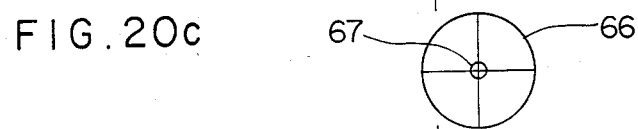
Figure 20D:
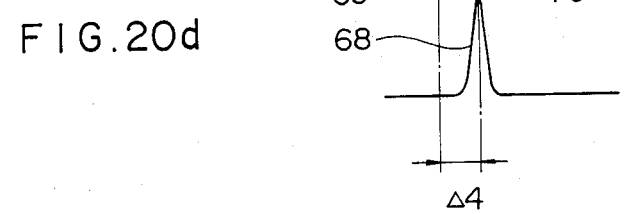

Upon completion of the reticle alignment, the operation of wafer alignment is started. This operation is exactly the same as that in the third embodiment. FIG. 20a shows an image of the wafer alignment pattern 14 on the movable slit 9. When the movable slit 9 is scanned, the detection signal waveform of light intensity distribution along the x direction obtained through the slit 9 takes a waveform 50 shown in FIG. 20b. The error Δ4 between the central position 70 of the spot diffraction pattern 67 stored upon completion of the reticle alignment and the central position 69 of the wafer alignment pattern 14 is determined and reduced to zero by moving the reticle or wafer, thus completing the wafer alignment.

As described above, according to the present embodiment, exactly the same effect is obtained as the third embodiment, although the difference of the present embodiment from the third embodiment is that a circular Fresnel zone plate 60 is used in the present embodiment as the reticle alignment pattern 20, and a four-quarter photodetector 65 is introduced as a detector therefor. It is possible to use a two-dimensional solid-state image sensor in place of the four-quarter photodetector.

It will be understood from the foregoing description that in the alignment method according to the present invention the coarse detection of reticle position in the reticle alignment process at the time of mounting the reticle and the fine detection of reticle position in the wafer alignment process for alignment between a wafer and a reticle can be automatically effected with the same reticle alignment pattern and the same optical alignment detection system. As a result, the number of the optical alignment detection system is reduced with a simple configuration, the system assembly and adjustment work 18 facilitated, and the alignment at exposure position is made possible, thereby contributing to an improved throughput, that is, to an improved productivity of semiconductors.

We claim:

1. In a method of reducing projection exposure for printing a reticle circuit pattern on a wafer through a reduction projection lens, an alignment method for a reduction projection type aligner comprising the steps of:
   detecting by an optical alignment detection system a coarse reticle position utilizing a reticle alignment pattern and moving the reticle to a fine reticle position in a reticle alignment process at the time of mounting the reticle in an initial position;
   detecting by the optical alignment detection system a fine reticle position by utilizing the reticle alignment pattern and detecting by the optical alignment detection system wafer position utilizing a wafer alignment pattern through the reduction projection lens; and
   aligning the wafer and the reticle by relatively moving one of the wafer and the reticle in a wafer alignment process in accordance with the detection thereof.

2. An alignment method for a reduction projection type aligner according to claim 1, including the steps of dividing said reticle alignment pattern into a plurality of pattern units, and arranging each of said pattern units outside of the reticle circuit pattern outwardly of an entrance pupil of the reduction projection lens, and detecting the reticle position by use of the diffraction effect of each pattern unit.

3. An alignment method for a reduction projection type aligner according to claim 2, including the steps of forming each of said pattern units of said reticle alignment pattern with one-dimensional and two-dimensional Fresnel zone plates of different shapes.

4. An alignment method for a reduction projection type aligner according to claim 1, wherein the step of fine detection of reticle position for the alignment between the wafer and the reticle is effected in such a manner that the light from said wafer alignment pattern is reflected from a light reflection region arranged inside or in the vicinity of said reticle circuit pattern outside of an entrance pupil of said reduction projection lens.

5. An alignment method for a reduction projection type aligner according to claim 1, including the steps of arranging said optical alignment detection system at a position downwardly of the reticle, and utilizing light having a different wavelength from the exposure light as an alignment pattern illumination light, so that the image position of a diffraction pattern from the reticle alignment pattern and the image position of the wafer alignment pattern are located at the same distance from the reticle surface.

6. A projection alignment apparatus for projecting a circuit pattern on a reticle to a wafer through a reduction projection lens comprising:
   a reticle alignment pattern formed on the reticle;
   a wafer alignment pattern formed on the wafer;
   optical alignment detection means for detecting the reticle alignment pattern and for detecting the wafer alignment pattern through the reduction projection lens;
   means for detecting a coarse reticle position by the optical alignment detection means utilizing the reticle alignment pattern and for moving the reticle to a fine reticle position in a reticle alignment process at the time of mounting the reticle in an initial position;
   means for detecting a fine reticle position by the optical alignment detection means utilizing the reticle alignment pattern and for detecting wafer position by the optical alignment detection means utilizing the wafer alignment pattern through the reduction projection lens; and
   means for aligning the wafer and the reticle by relatively moving one of the wafer and the reticle in a wafer alignment process in accordance with the detection thereof.

7. A projection alignment apparatus according to claim 6, wherein the reticle alignment pattern includes a plurality of pattern units, and each of the pattern units is arranged outside of the reticle circuit pattern outwardly of an entrance pupil of the projection lens, the reticle position being detecting by use of the diffraction effect of each pattern unit.

8. A projection alignment apparatus according to claim 7, wherein each of the pattern units of the reticle alignment pattern includes one-dimensional and two-dimensional Fresnel zone plates of different shapes.

9. A projection alignment apparatus according to claim 6, wherein the means for fine detection of reticle position for the alignment between the wafer and the reticle enables light from the alignment pattern to be reflected from a light reflection region arranged inside or in the vicinity of the reticle circuit pattern outside of an entrance pupil of the projection lens.

10. A projection alignment apparatus according to claim 6, wherein the optical alignment detection means is arranged at a position downwardly of the reticle, and light having a different wavelength from exposure light is utilized as an alignment pattern illumination light so that the image of a diffraction pattern from the reticle alignment pattern and the image position of the wafer alignment pattern are located at the same distance from the reticle surface.

11. A projection alignment apparatus for projecting a circuit pattern on a reticle to a wafer through a projection lens comprising:
   a reticle for forming mask alignment pattern groups including fine alignment pattern elements at at least two peripheral portions of the reticle for enabling detection of position in two axial directions, and a plurality of coarse alignment pattern elements of different shapes extending about the fine alignment pattern elements;
   alignment detecting optical means corresponding to the mask alignment pattern groups including an illumination light source, an illumination optical system for illuminating the mask alignment pattern groups, an image optical system for forming light images from the mask alignment pattern groups, an image pick-up means for picking-up the light images formed by the image optical system and converting the light images to picture signals;
   coarse alignment means for detecting the moving direction and extent thereof in dependence on the pattern elements of the mask alignment pattern groups detected by the alignment detecting optical means, and for moving the reticle and for positioning the fine alignment pattern elements within the visual field of the alignment detecting optical means;
   two wafer position detecting means for detecting the positions of two alignment pattern elements on the wafer through the projection lens; and fine alignment means for detecting the relative abberation between the alignment pattern elements of the wafer detected by each of the wafer position detecting means and the fine alignment pattern elements positioned by the coarse alignment means and detected by the alignment detecting optical means, and for finely relatively moving one of the wafer and the reticle and for enabling alignment in the two axial directions.

12. A projection alignment apparatus according to claim 11, wherein the plurality of pattern elements are arranged outside of the reticle circuit pattern outwardly of an entrance pupil of the projection lens, the reticle position being detected by use of the diffraction effect of the pattern elements.

13. A projection alignment apparatus according to claim 12, wherein the mask alignment groups include one-dimensional and two-dimensional Fresnel zone plates of different shapes.

14. A projection alignment apparatus according to claim 11, wherein the fine alignment means for enabling alignment means for enabling alignment between the wafer and the reticle enables light from the mask alignment pattern groups to be reflected from a light reflection region arranged inside or in the vicinity of the reticle circuit pattern outside of an entrance pupil of the projection lens.

15. A projection alignment apparatus according to claim 11, wherein the alignment detecting optical means is arranged at a position downwardly of the reticle, and light having a different wavelength from exposure light is utilized as an alignment pattern illumination light so that the image of a diffraction pattern for enabling reticle alignment and the image position for enabling wafer alignment are located at the same distance from the reticle surface.

* * * * *